United States Patent
Hao et al.

(10) Patent No.: US 6,894,364 B2
(45) Date of Patent: May 17, 2005

(54) CAPACITOR IN AN INTERCONNECT SYSTEM AND METHOD OF MANUFACTURING THEREOF

(75) Inventors: Ming-Yin Hao, Taichung (TW); Tri-Rung Yew, Hsinchu (TW); Coming Chen, Hsinchu (TW); Tsong-Minn Hsieh, Miaoli (TW); Nai-Chen Peng, Hsinchu (TW); Jih-Cheng Yeh, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/248,833

(22) Filed: Feb. 24, 2003

(65) Prior Publication Data

US 2004/0157392 A1 Aug. 12, 2004

(30) Foreign Application Priority Data

Feb. 11, 2003 (TW) .......................... 92102732 A

(51) Int. Cl.$^7$ .......................... H01L 29/00; H01L 23/48; H01L 23/52; H01L 29/40
(52) U.S. Cl. .......................... 257/532; 257/756; 257/761; 257/767
(58) Field of Search ................................. 257/532, 758, 257/761, 767; 438/118

(56) References Cited

U.S. PATENT DOCUMENTS

| | | | | |
|---|---|---|---|---|
| 5,063,177 A | * | 11/1991 | Geller et al. | 438/107 |
| 5,451,551 A | * | 9/1995 | Krishnan et al. | 438/626 |
| 2001/0020713 A1 | * | 9/2001 | Yoshitomi et al. | 257/306 |
| 2003/0211731 A1 | * | 11/2003 | Kai et al. | 438/638 |
| 2004/0106266 A1 | * | 6/2004 | Huang et al. | 438/393 |

* cited by examiner

Primary Examiner—William M. Brewster
(74) Attorney, Agent, or Firm—Jiang Chyun IP Office

(57) ABSTRACT

A fabrication method for an integrated device having a capacitor in an interconnect system is described. At least a first exposed metal line and a second metal line are provided in an insulating layer. A stack layer is deposited and patterned to form a film stack structure over the second metal line. An inter-metal dielectric layer is formed over the film stack structure, the first metal line and the insulating layer. At least a first dual damascene interconnect and a second dual damascene interconnect are formed over and in contact with the first metal line and the film stack structure, respectively.

13 Claims, 4 Drawing Sheets

CAPACITOR IN AN INTERCONNECT SYSTEM AND METHOD OF MANUFACTURING THEREOF

CROSS REFERENCE TO RELATED APPLICATIONS

This application claims the priority benefit of Taiwan application serial no. 92102732, filed on Feb. 11, 2003.

BACKGROUND OF INVENTION

1. Field of the Invention

The present invention relates to an integrated circuit device and a fabrication method thereof. More particularly, the present invention relates to a capacitor in a dual damascene interconnect system and a method of integrating the fabrication of a capacitor into a dual damascene process.

2. Description of Related Art

Capacitors are often used in integrated circuits (ICs). Conventionally, forming a capacitor in an interconnect system requires great deviation from and modification to the normal interconnect manufacturing process. A typical manufacturing method for a capacitor or an antifuse element in an interconnect system is described in U.S. Pat. No. 6,124,194 with reference to FIGS. 1A–1D. As shown in FIG. 1A, two exposed metal lines 102, 104 are formed in an insulation layer 100. Another insulation layer 106 is formed over the insulation layer 100 covering the metal lines 102, 104. The insulation layer 106 further comprises a via 108 therein, wherein the via 108 is in contact with the metal line 102. A silicon nitride layer 110 is formed over the insulation layer 106 and the via 108. The silicon nitride layer 110 is further patterned to form an opening 112 over the via 108 and an opening 114 over the first insulation layer 106 over the metal line 104. Referring to FIG. 1B, a fusing element layer 116 is then formed over the structure, covering the patterned silicon nitride layer 110 and filling the openings 112, 114. Referring to FIG. 1C, the fusing element layer 116 is patterned to form a capacitor element or a fusing element 118 in the opening 112. An insulation layer 120 is formed over the structure. The insulation layer 120 is patterned to form a metal line opening 122 over the capacitor element 118 and a conductive line opening 124 in the second insulation layer 120. The first insulation layer 106 is further patterned to form a via opening 126. Continuing to FIG. 1D, a metal layer is deposited to form a metal line 130 and a dual damascene structure 132.

However, as can be seen from the above discussion, the manufacturing process to integrate a capacitor in an interconnect system is complicated. Since multiple masking steps are required to form a capacitor and an interconnect system, the resulting process is expensive and time-consuming.

SUMMARY OF INVENTION

Accordingly, the present invention provides a capacitor in a dual damascene interconnect system and a method of integrating the fabrication of a capacitor into a dual damascene process, wherein a typical dual damascene process is performed without having extensive deviation and modification to the process.

Further, the present invention provides a capacitor in a dual damascene interconnect system and a method of integrating the fabrication of a capacitor into a dual damascene process, wherein the processing window is wider and a higher packing density is resulted.

In accordance to the method of integrating the fabrication of a capacitor into a dual damascene process of the present invention, a first and a second exposed metal lines covered by a first insulation layer are provided. A film stack structure is then deposited over the second exposed metal line. An inter-metal dielectric layer is further formed over the stack layer, the first insulation layer, the first and the second metal lines. A first dual damascene interconnect and a second dual damascene interconnect are formed over and in contact with the first metal line and the film stack structure, respectively.

According to this aspect of the present invention, the film stack structure is formed with, for example, alternating layers of tantalum nitride/amorphous silicon/tantalum nitride. Further, an oxygen plasma treatment is performed on the amorphous silicon.

In accordance to the present invention, a capacitor in a dual damascene interconnect system comprises at least a first copper line and a second copper line disposed in an insulating layer. An inter-metal dielectric layer is disposed over the insulating layer, and at least a first dual damascene structure and a second dual damascene structure are disposed in the inter-metal dielectric layer over the first copper line and the second copper line, respectively, wherein the first dual damascene structure is in contact with the first copper line. A capacitor is disposed between and in contact with the second dual damascene structure and the second copper line. Further, the capacitor is located, for example, in the via level of the dual damascene structure.

According to the present invention, a typical dual damascene process can be performed subsequent to the formation of the capacitor. A minimum disturbance is introduced to the interconnect manufacturing process flow. Further, only one additional mask is required to form a capacitor in a dual damascene interconnect system, the proposed method is thus cost effective.

Further the processing window for the patterning of the film stack structure is not tight, a higher packing density is resulted.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 2A to 2D depict a method of integrating the fabrication of a capacitor into a dual damascene process according to one aspect of the present invention.

Figure 1A:
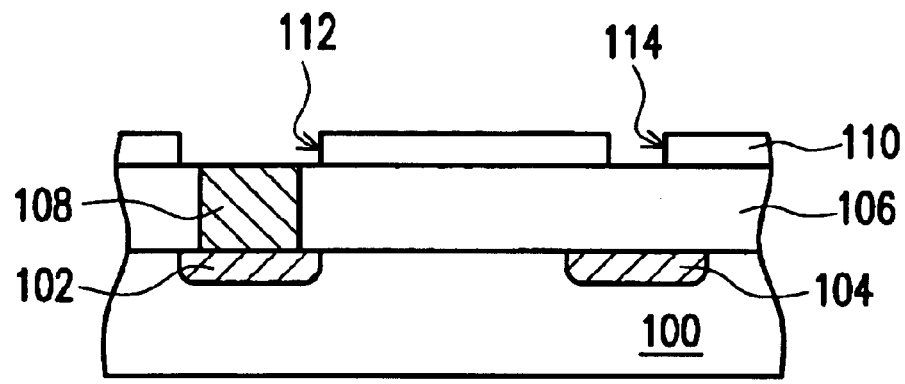
FIGS. 1A to 1D are schematic diagrams depicting a manufacturing method for a capacitor in an interconnect system according to the prior art.
Figure 1B:
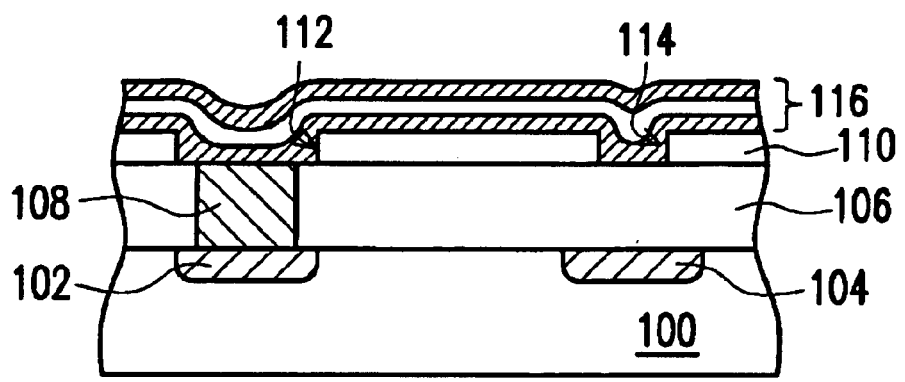
Figure 1C:
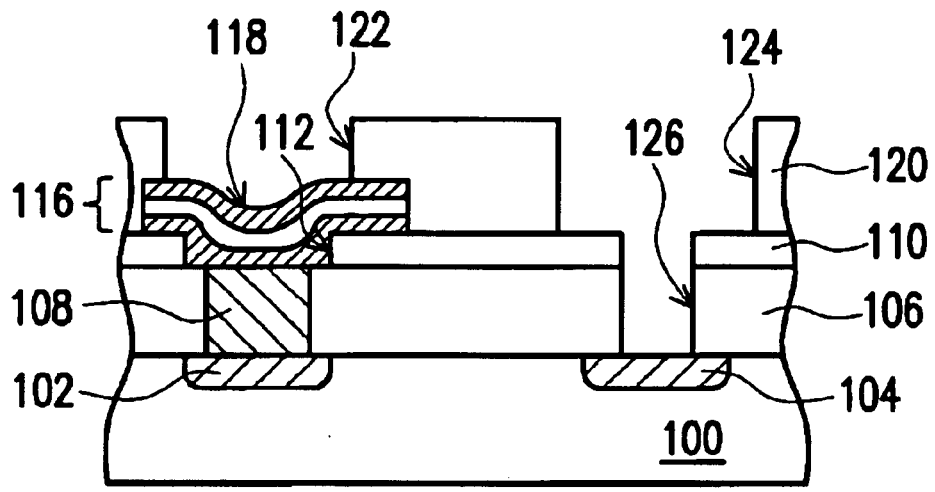
Figure 1D:
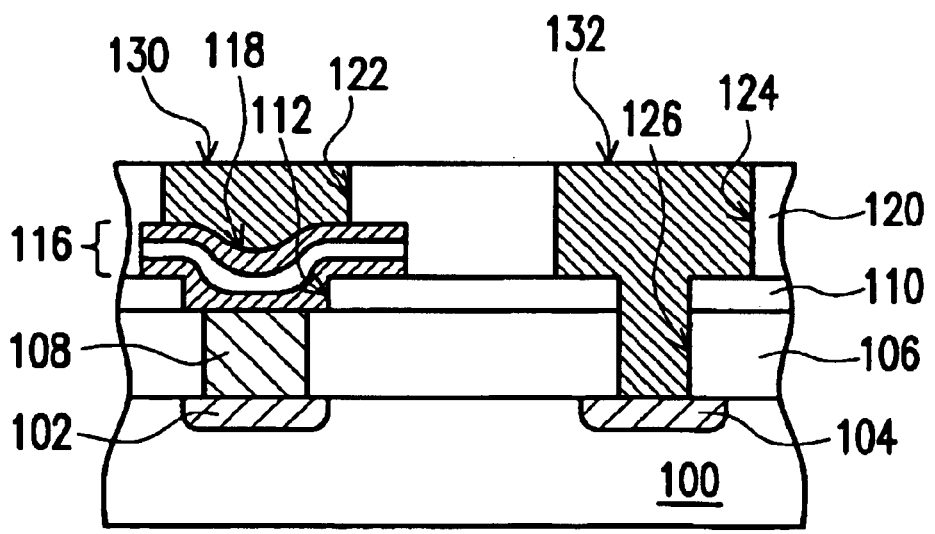
Figure 2A:
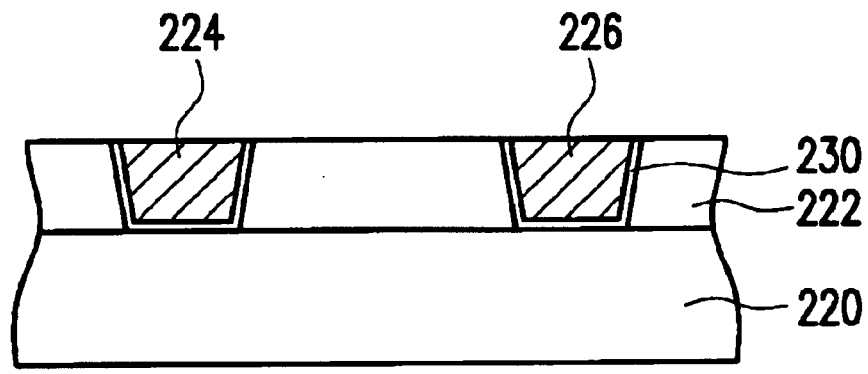
FIGS. 2A to 2D are schematic diagrams depicting a manufacturing method of a capacitor in a dual damascene interconnect system according to one aspect of the present invention.

Referring to FIG. 2A, an insulating layer 222 is provided on a semiconductor wafer layer 220. The semiconductor wafer layer 220 is, for example, an insulating layer, formed over a substrate (not shown), such as a silicon substrate, which may include numerous devices formed thereon and therein. The insulating layer 222 may includes any material that is resistance to the conduction of electricity, for example, doped or undoped silicon oxide, silicate glass such as phosphosilicate glass or fluorinated silicon glass, tetraethylorthosilane, low-k (low dielectric constant) dielectric materials such as spin on dielectrics, fluorinated oxides, or the like. The insulating layer 222 further comprises two exposed conductive elements, for example, two metal lines 224, 226. The metal lines 224, 226, for example, copper lines, are formed by, for examples, forming trenches (not shown) in the insulating layer 222 and a conformal barrier layer 230 along the surface of the trenches. A metal layer (not shown) is further formed on the barrier layer 230, filling the trenches. Chemical mechanical polishing process or etching back is further executed to remove the excess metal layer and barrier layer.

Figure 2B:
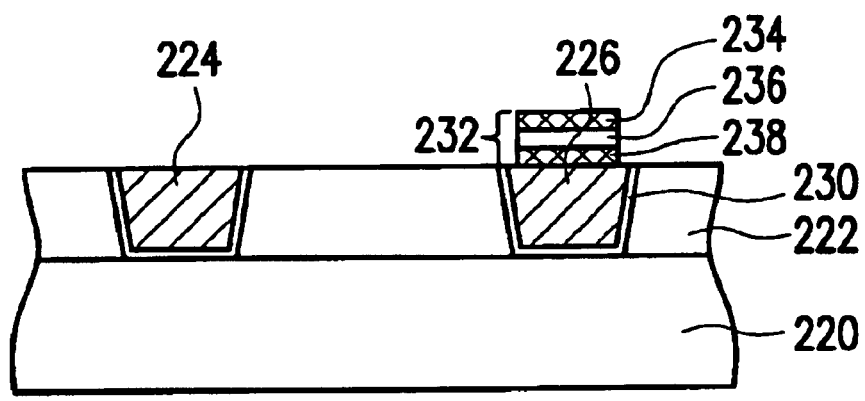

Referring to FIG. 2B, a stack layer (not shown), preferably about 1000 to 1500 angstroms thick, is formed over the insulating layer 222, the metal line 226 and the metal line 224. The stack layer is then patterned and etched using the insulation layer 222 and the metal lines 224, 226 as etch stop to form a film stack structure 232 over the metal line 226. The film stack structure 232, which serves as a capacitor element, comprises, for example, alternating layers of a tantalum nitride (TaN) layer 234/an amorphous silicon layer 236/a tantalum nitride (TaN) layer 238. The film stack structure 232, however, may also comprises alternating layers of TaN/amorphous carbide/TaN, TaN/silicon carbide/TaN, titanium nitride (TiN)/amorphous silicon/titanium nitride (TiN), TiN/amorphous carbide/TiN, TiN/silicon carbide/TiN, etc.

Further, according to this aspect of the present invention, an oxygen plasma treatment is performed on the amorphous silicon layer 236 in the film stack structure 232. The oxygen plasma treatment is performed to form a thin silicon oxide film (not shown in Figure) on the amorphous silicon layer 236.

After the formation of the film stack structure 232, a typical dual damascene manufacturing process, in which either a trench first or a via first dual damascene profile etch, is performed in an inter-metal dielectric layer.

Figure 2C:
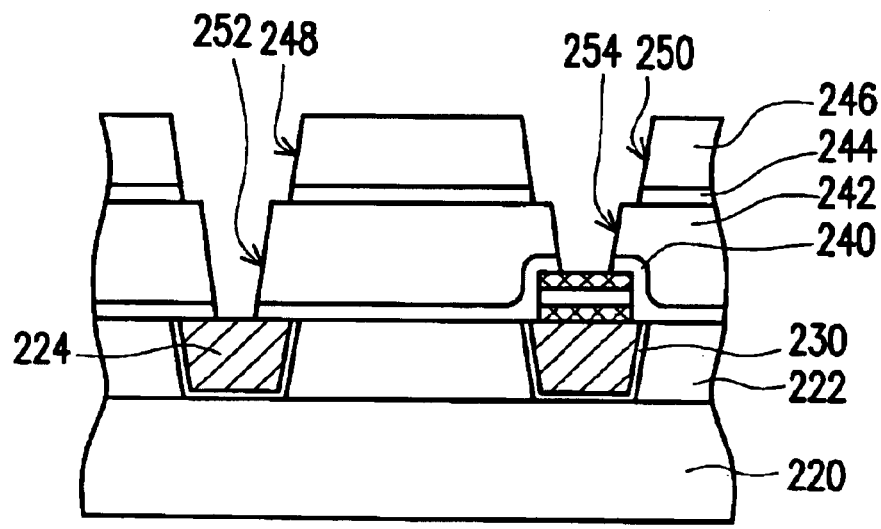

Referring to FIG. 2C, a conformal insulating thin film 240 is formed over the insulating layer 222, the metal lines 224, 226 and the film stack structure 232. After this, an insulating layer 242 is formed over the conformal insulating thin film 240. Another insulating thin film 244 is further formed over the insulating layer 242, followed by forming an insulating layer 246 over the insulating thin film 244. In accordance to the present invention, the insulating layer 242 may be planarized before forming the insulating thin film 244. The insulating thin films 240, 244, which serve as etch stop layer, are about 1300 angstroms thick. The insulating thin films 240, 244 are formed with materials comprising, for example, silicon nitride, silicon carbide, etc. The insulating layers 242, 246, which serve as the inter-metal dielectric layer, are formed with materials comprising, for example, doped or undoped silicon oxide, silicate glass, low-k dielectric materials, etc.

Still referring to FIG. 2C, photolithography and etching are conducted to pattern the insulating layer 246 and the insulating thin film 244 to form a conductive line opening 248 substantially over the metal line 224 and a conductive line opening 250 substantially over the film stack structure 232. Another photolithography and etching are further conducted to define the insulating thin film 240 and the insulating layer 242 under the conductive line openings 248 and 250 to form a via opening 252 and a via opening 254, respectively.

In another aspect of the present invention, photolithography and etching may conduct to pattern the insulating layers 242, 246 and the insulating thin films 244, 240 to form the via openings 252, 254 first in the insulating layer 242. Another photolithography and etching are then performed to pattern the insulating layer 246 and the insulating thin film 244 to form the conductive line openings 248 and 250.

Figure 2D:
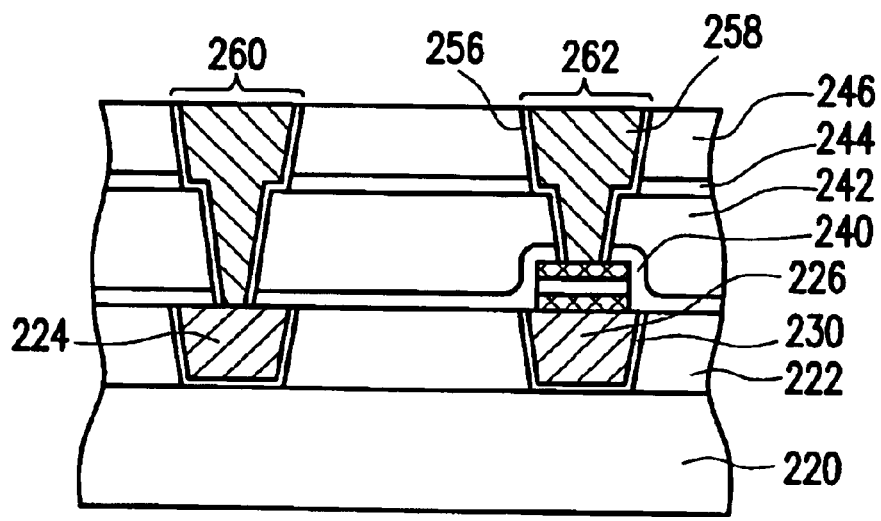

Continuing to FIG. 2D, a barrier layer 256 and a metal layer 258 are sequentially formed over the insulating layer 246, filling the conductive line openings 248, 250 and the via openings 252, 254 to form a dual damascene interconnect 260 and a dual damascene interconnect 262, respectively. The barrier layer 256 comprises, for example, titanium nitride (TiN) and the metal layer 258 comprises, for example, copper, titanium, tantalum, aluminum, aluminum copper alloy, etc. The barrier layer 256 and the metal layer 258 layer are formed by, for example, physical vapor deposition (PVD) or chemical vapor deposition (CVD).

The processing steps for forming the stack layer to the dual damascene interconnects can be repeated to form the next level of the interconnect.

Accordingly, the integrated device having a capacitor in a dual damascene interconnect system formed according to the present invention comprises at least two metal lines 224, 226, for example, copper lines, disposed in the insulating layer 222. The film stack structure 232, which comprises, for example, alternating layers of a tantalum nitride layer 234, an amorphous silicon layer 236 and a tantalum nitride layer 238, is disposed over the metal line 226. The amorphous silicon layer in the film stack structure 232 is, for example, an oxygen plasma treated amorphous silicon layer. The film stack structure 232 disposed over the metal line 226 may extend beyond the perimeter of the metal line 226 or confine within the perimeter of the metal line 226. The dual damascene interconnects 260, 262 are configured in the insulating thin film 240, the insulating layer 242, the insulating thin film 244 and the insulating layer 246 over and in contact with the metal line 224 and the film stack structure 232, respectively. Further, the film stack structure 232 is disposed in, for example, the via level of the dual damascene interconnects 260, 262.

In accordance to the method of integrating the fabrication of a capacitor into a dual damascene process of the present invention, subsequent to the formation of the film stack structure, a typical dual damascene process is carried out to complete the formation of a capacitor in a dual damascene interconnect system. A minimum disturbance is introduced to the manufacturing process flow. Further, only one additional mask is required to form a capacitor in a dual damascene interconnect system. The method of the present invention is thus cost effective.

Further, the processing window for the patterning of the stack layer is not very tight, a higher packing density can provide. The present invention is thus suitable for a high density/fine pitch (<1 $\mu$m pitch) metal-insulator-metal application.

Additionally, since an antifuse has a structure similar to that of a capacitor, the present invention is appropriate for an antifuse application. Further, the present invention teaches performing an oxygen plasma treatment to form a thin oxide film on the amorphous silicon layer in the film stack structure. The problem of leakage current is mitigated especially when voltage is applied to the top of an antifuse.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated device having a capacitor in an interconnect system, comprising:
   a plurality of metal lines;
   a planarized first insulating layer disposed over the metal lines;
   an etch stop layer disposed over the planarized first insulating layer;
   a second insulating layer disposed over the etch stop layer;
   a first via, a second via and the capacitor configured in the first insulating layer, wherein the first via is configured over and in contact with the capacitor element, the capacitor is configured over and in contact with one of the metal lines, and the second via is configured over and in contact with another metal line; and
   a first conductive line and a second conductive line configured in the second insulating layer and the etch stop layer, wherein the first conductive line is configured over and connected to the first via and the second conductive line is configured over and connected to the second via, wherein said metal lines, said first and second vias, said first and second conductive lines have tapered sidewalls and a barrier lining on said sidewalls.

2. The device of claim 1, wherein the capacitor comprises a stack layer of a tantalum nitride layer, an amorphous silicon layer and a tantalum nitride layer.

3. The device of claim 2, wherein the amorphous silicon layer further comprises a thin oxide film thereon.

4. The device of claim 1, wherein the metal line comprise copper.

5. The device of claim 1, wherein the first via, the second via, the first conductive line and the second conductive line comprise copper.

6. An integrated device having a capacitor in a dual damascene interconnect system, comprising:
   a plurality of copper lines;
   an insulating layer disposed over the copper lines;
   at least a first dual damascene structure and a second dual damascene structure disposed in the insulating layer, wherein the first dual damascene structure is in contact with one of the copper lines; and
   a capacitor element disposed between and in contact with another copper line and the second dual damascene structure, wherein said first and second dual damascene structures have an etch stop layer dividing a wider cavity from a narrower cavity of the damascene structures.

7. The device of claim 6, wherein the capacitor element comprises a stuck layer of a tantalum nitride layer, an amorphous silicon layer and a tantalum nitride layer.

8. The device of claim 7, wherein the amorphous silicon layer further comprises a thin oxide film thereon.

9. The device of claim 6, wherein first dual damascene structure and the second dual damascene structure are formed with copper.

10. The device of claim 6, wherein the first insulating layer and the second insulating layer are formed with a material selected from the group consisting of an oxide material, a silicate glass material, a tetraethylorthosilane material, and a low-k dielectric material.

11. The device of claim 6, wherein the capacitor element is disposed at a via level of the first dual damascene structure and the second dual damascene structure.

12. The device of claim 6, further comprising a barrier layer between the first/second dual damascene structure and the first/second insulating layer.

13. The device of claim 1, further comprising a barrier layer between the first/second via and the first insulating layer, and the barrier layer also disposed between the first/second conductive line and the second insulating layer.

* * * * *